United States Patent [19]

Ohashi et al.

[11] Patent Number: 4,943,826
[45] Date of Patent: Jul. 24, 1990

[54] IMAGE FORMING DEVICE WITH SUPPLEMENTARY EXPOSURE DEVICE

[75] Inventors: Kunio Ohashi; Shoichi Nagata, both of Nara, Japan

[73] Assignee: Sharp Kabushiki Kaisha, Osaka, Japan

[21] Appl. No.: 252,678

[22] Filed: Oct. 3, 1988

[30] Foreign Application Priority Data

Oct. 23, 1987 [JP] Japan .................. 62-268794

[51] Int. Cl.$^5$ ............................................. G03B 27/32
[52] U.S. Cl. ...................................... 355/27; 355/38
[58] Field of Search ..................... 355/32, 35, 38, 41, 355/68, 77, 27, 28

[56] References Cited

U.S. PATENT DOCUMENTS 4,482,624  11/1984  Arney et al. ................... 430/138
4,896,183   1/1990  Ohashi et al. .................. 355/27

Primary Examiner—Michael L. Gellner
Assistant Examiner—Khanh Dang
Attorney, Agent, or Firm—Flehr, Hohbach, Test, Albritton & Herbert

[57] ABSTRACT

An image forming apparatus of a type using a light receiving sheet coated with pressure-rupturable microcapsules encapsulating a colorless dye and a radiation-curable material is provided not only with a supplementary exposure device with which the sheet may be supplementarily exposed to light so as to have its radiation-curability characteristics corrected but also with an input device through which a command can be inputted whether or not the sheet should be supplementarily exposed and a driving mechanism which drives or does not drive the supplementary exposure device, depending on the command from the input means.

11 Claims, 4 Drawing Sheets

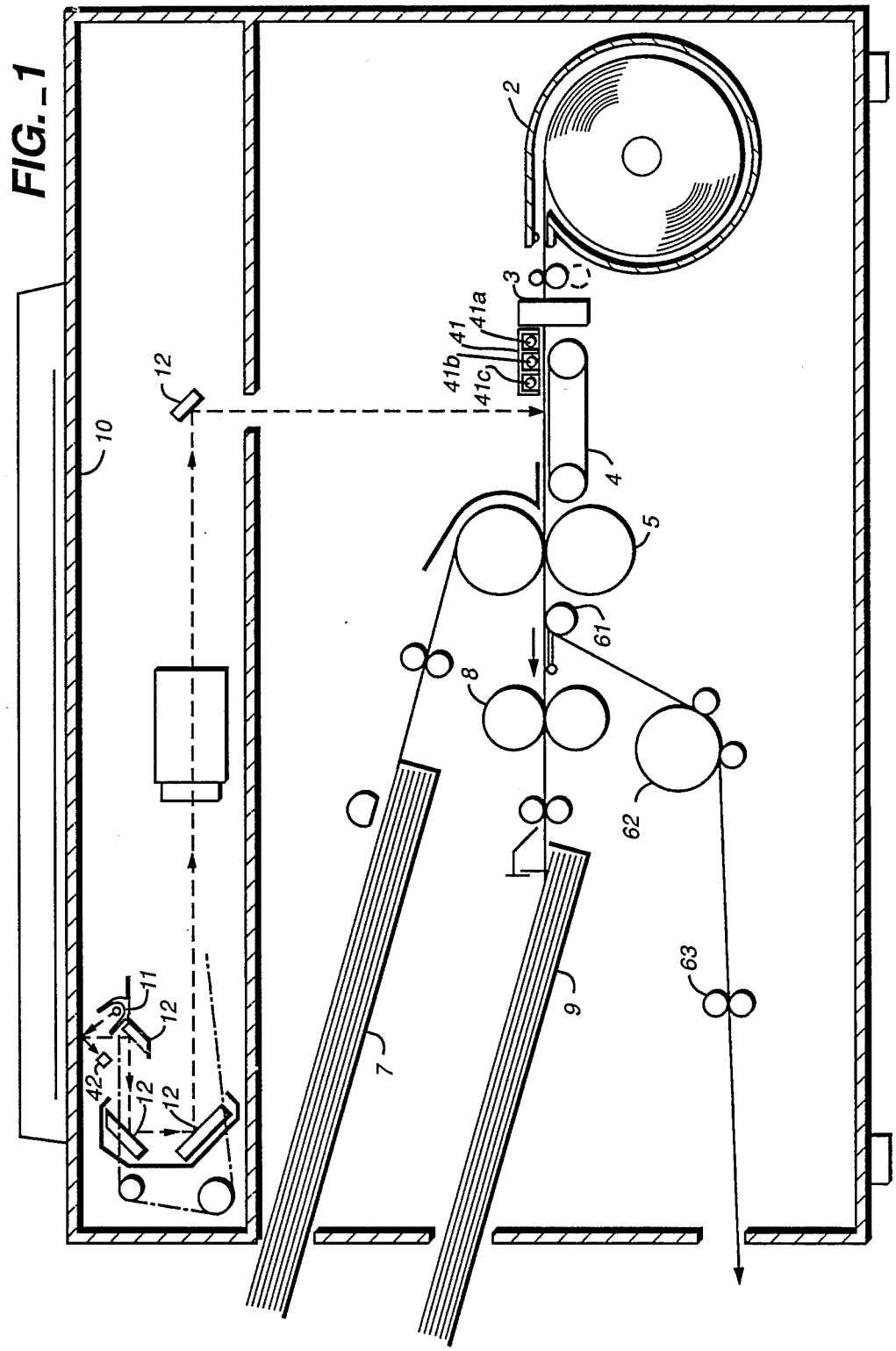
FIG._1

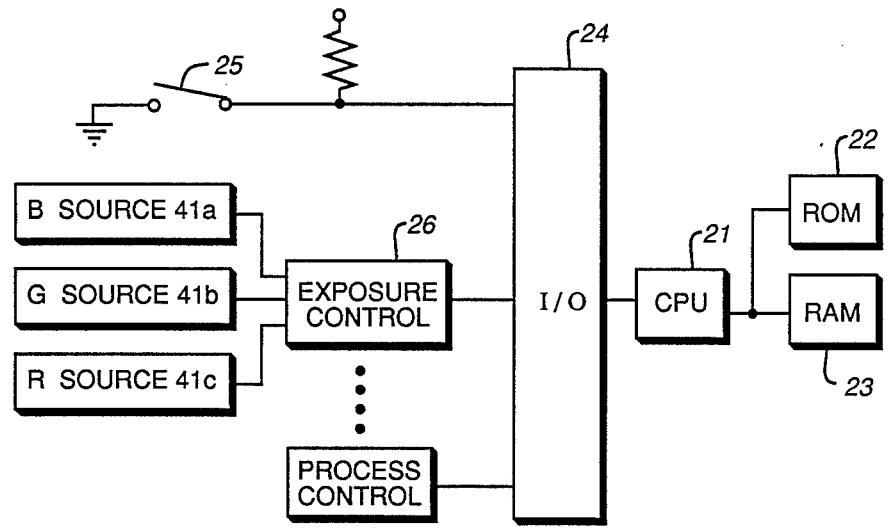
FIG._2
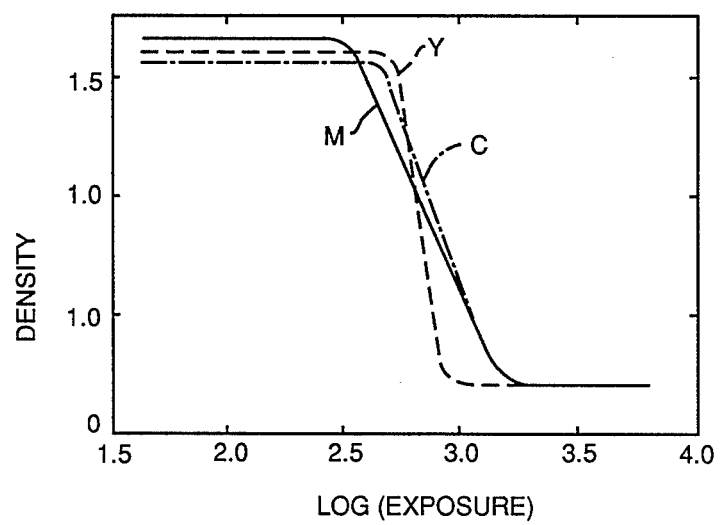
FIG._3A

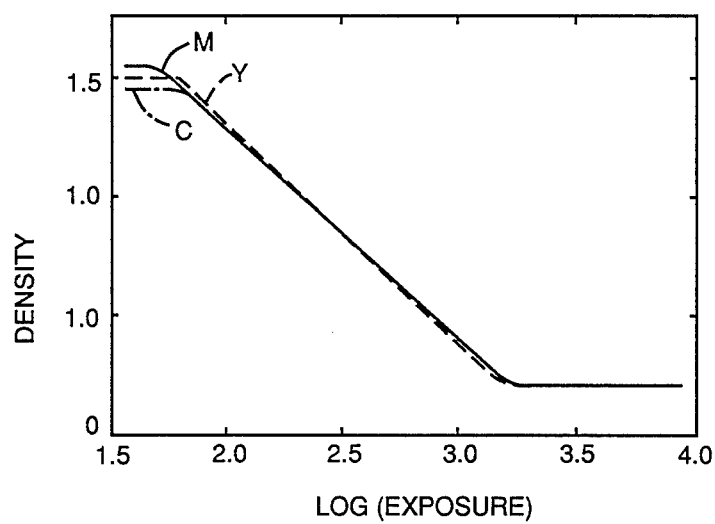
FIG._3B
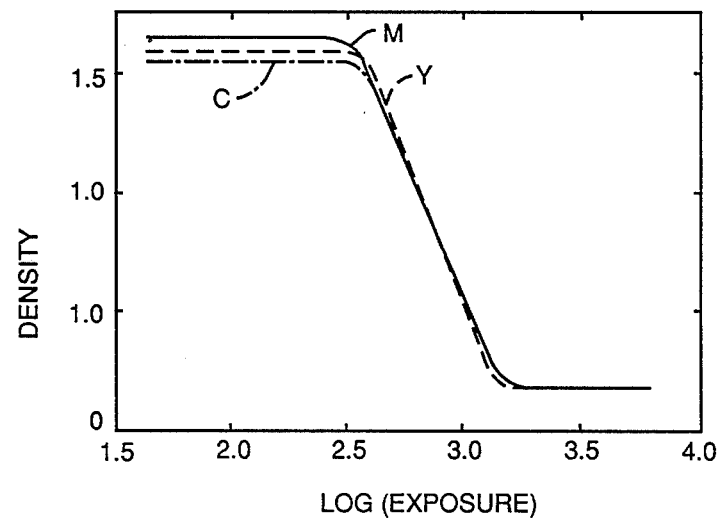
FIG._3C

| COMBINATION | SOURCE VOLTAGE | | | GRADATIONS | QUALITY OF COPY OF PHOTO |
| --- | --- | --- | --- | --- | --- |
| | B | G | R | | |
| 1 | 8.3 V | 0 V | 4.0 V | 4 | GOOD |
| 2 | 10.3 | 3.0 | 7.0 | 6 | GOOD |
| 3 | 11.2 | 5.0 | 7.7 | 7 | EXCELLENT |
| 4 | 12.0 | 6.0 | 8.2 | 9 | EXTREMELY EXCELLENT |
FIG._4
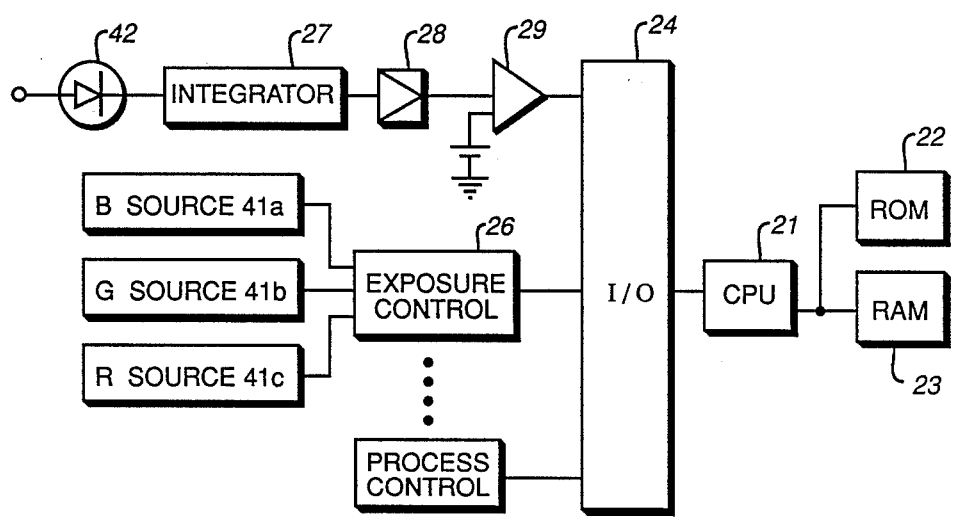
FIG._5

IMAGE FORMING DEVICE WITH SUPPLEMENTARY EXPOSURE DEVICE

BACKGROUND OF THE INVENTION

This invention relates to an image forming apparatus which uses a light receiving sheet coated with microcapsules and more particularly to such an image forming apparatus provided with a supplementary exposure device for correcting the radiationcurability characteristics of the light receiving sheet.

Japanese Patent Publication No. Tokkai 58-88739 has disclosed a method for forming a visible image by exposing a light receiving sheet coated with photosensitive microcapsules encapsulating within a resin shell a colorless dye and a radiation-curable material to an image forming beam of light reflected from a document to be copied to thereby form a selectively hardened image, superposing on this selectively hardened image an image receiving sheet coated with a developing agent having a chromogenic effect on the colorless dye and pressing these two sheets together. If use is made of colorless dyes for coloring in yellow, magenta and cyanic encapsulated together with radiation-curable materials sensitive to blue, green and red, respectively, and if these microcapsules encapsulating these three different combinations of a colorless dye and a radiation-curable material are uniformly distributed over the surface of a light receiving sheet, a full color image can be produced by exposing such a sheet only once to an image forming white beam of light carrying color data. This method of forming a full color image is advantageous over the conventional electrophotographic method because the image forming process can be significantly simplified.

Light receiving sheets of this type have their own peculiar radiation-curability characteristics and the quality of the image formed thereon depends significantly on these characteristics. For example, if the so-called gamma value of the light receiving sheet is too large, gradation becomes low and it becomes difficult to reproduce intermediate colors. In the case of a photograph, for example, the image quality becomes poor without the intermediate colors faithfully reproduced. In Japanese Patent Application No. 62-198746, the present inventors disclosed an image forming apparatus provided with a supplementary exposure device for correcting the radiation-curability characteristics of the light receiving sheet such as the gamma. With a supplementary exposure of the light receiving sheet, the oxygen content inside the photosensitive microcapsules can be reduced such that the radiationcurability characteristics of the light receiving sheet are corrected and images with high gradation values can be formed.

Although such a supplementary exposure device makes it possible to obtain high-quality images with high gradiation values in the case of photographs with intermediate colors, a high gradiation level makes an image of low quality in the case of characters and graphs. In the case of a typewritten document, for example, the ink density is not always uniform and if such a document is copied by using a copier having a supplementary exposure device of the type described above, the non-uniformity of ink density is reproduced as on the original document. This makes the copied characters unclear and difficult to read.

SUMMARY OF THE INVENTION

It is therefore an object of the present invention in view of the above to provide an image forming apparatus with a supplementary exposure device with which both images of characters and images of photographs of high quality can be obtained.

An image forming apparatus with a supplementary exposure device with which the above and other objects can be achieved is characterized as being provided with an input means for inputting a signal indicating whether or not there is to be a supplementary exposure and a driving means for driving the supplementary exposure device according to the input through this input means.

With an image forming apparatus having a supplementary exposure device thus structured, an input signal indicating no supplementary exposure is transmitted if an image with a clear contrast is desired but a different input signal indicating a supplementary exposure is transmitted if an image, for example, of a photograph with intermediate colors is desired. Thus, the supplementary exposure device may or may not be operated, depending on the kind of image desired. If there is no supplementary exposure, the produced image is hard, being high in contrast. If there is a supplementary exposure, a softer image with high gradation values suited for photographs can be obtained.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a schematic front sectional view of an image forming apparatus with a supplementary exposure device embodying the present invention, FIG. 2 is a block diagram of the control system of the apparatus shown in FIG. 1, FIG. 3A is a graph showing the image density characteristics obtained by an exemplary light receiving sheet and FIGS. 3B and 3C are the image density characteristics with supplementary exposure, FIG. 4 is an example of voltage setting for supplementary exposure, and FIG. 5 is a block diagram of another image forming apparatus embodying the present invention.

In all these figures, components which are substantially identical or function substantially equivalently are indicated by the same numerals and are not separately explained.

DETAILED DESCRIPTION OF THE INVENTION

With reference to FIG. 1 which shows the general structure of an image forming apparatus embodying the present invention, its main housing structure 1 contains at a lower right-hand side thereof a cassette 2 containing a roll of light receiving sheet. This light receiving sheet is for producing full-color images and is formed by uniformly coating a base sheet of polyester or the like with (i) what will hereinafter be referred to as Y capsules which are microcapsules encapsulating a radiation-curable material sensitive to blue (B) light and a colorless dye which becomes yellow (Y) by a chromogenic reaction, (ii) what will hereinafter be referred to as M capsules which are microcapsules encapsulating a radiation-curable material sensitive to green (G) light and a colorless dye which becomes magenta (M) by a chromogenic reaction, and (iii) what will hereinafter be referred to as C capsules which are microcapsules encapsulating a radiation-curable material sensitive to red (R) light and a colorless dye which becomes cyanic (C) by a chromogenic reaction.

An end part of the light receiving sheet is taken out of the main housing structure 1 through a cutter 3, a sheet supporting table 4, pressure rollers 5 and guide rollers 61, 62 and 63. On the left-hand side of the main housing structure 1 is a supply tray 7 for storing image receiving sheets. These image receiving sheets are supplied therefrom one sheet at a time to the pressure rollers 5 and discharged through heat rollers 8 to a discharge tray 9. The pressure rollers 5 serve to press together the light receiving sheet on which a selectively hardened image has been formed and an image receiving sheet superposed thereon to form a visible color image on the image receiving sheet.

At the top of the main housing structure 1 is a document table 10 for carrying thereon an original document to be copied. Below this document table 10 is an optical system comprised of a light source 11 for scanning the original document on the document table 10 and mirrors. When the optical system scans the document, the image forming beam of light reflected therefrom is directed onto the sheet supporting table 4 such that the light receiving sheet being supported thereon is exposed. Provided above the sheet supporting table 4 is a supplementary exposure device 41 for correcting the radiationcurability characteristics of the light receiving sheet. The supplementary exposure device 41 includes a B light source 41a which emits B light, a G light source 41b which emits G light and an R light source 41c which emits R light so as to correct the radiation-curability characteristics of the Y capsules, the M capsules and the C capsules, respectively. Each of these light sources 41a, 41b and 41c is comprised of a plurality of halogen tungsten lamps arranged transversely to the direction of motion of the light receiving sheet and covered by a filter each adapted to transmit only B light, G light and R light, respectively, such that the light receiving sheet traveling on top of the sheet supporting table 4 can be uniformly exposed to light therefrom in the direction of its width. Alternatively, use may be made of light emitting diodes or an electroluminescence panel for this purpose.

With reference next to the block diagram shown in FIG. 2, a central processing unit CPU 21 controls the overall operation of the apparatus. Its control program is preliminarily stored in a read-only memory ROM 22 and a random-access memory RAM 23 is provided to be used as a working area in the execution of this control program. Although not shown in FIG. 1 a control panel of a well known type is provided on the upper surface of the main housing structure 1, including an on-off switch 25 for activating and deactivating the supplementary exposure device 41 of the present invention. This switch 25 is of an ordinary kind and when it is switched on, an onsignal is transmitted through an interface circuit (I/O) 24 to the CPU 21. The CPU 21 responds to the on-signal from the switch 25 by outputting control data for a supplementary exposure to a control device 26 for the supplementary exposure device 41. The control device 26 thereby determines the output levels of the B, G and R light sources 41a, 41b and 41c.

The output levels of the light sources 41a, 41b and 41c are controlled, for example, by adjusting the voltages applied thereto. The degrees of correction on the radiation-curability characteristics vary according to the output level. The radiationcurability characteristics of an exemplary light receiving sheet which may be used with an image forming apparatus embodying the present invention may be as shown in FIG. 3A. This graph shows the densities of colors (Y, M and C) in an image formed by copying a gray scale with densities from 0.05 to 1.85 with pitch = 0.1. The horizontal axis indicates exposure corresponding to the gray scale density.

FIG. 3A shows that the gamma values (represented by the slope of the curves) of this light receiving sheet are large and that there are 4 gradations. Since the radiation-curability characteristics are different among the Y, M and C capsules, images produced by this light receiving sheet tend to be yellowish in low-density areas and blue-greenish in high-density areas. If a photograph, for example, is copied by using such a light receiving sheet, intermediate gradations cannot be properly reproduced and hard images are obtained as a result and highdensity and low-density areas become unnaturally colored. For this reason, the operator operates the switch 25 to the ON position to carry out a supplementary exposure.

FIG. 4 shows an example of voltage setting for controlling the outputs from the light sources 41a, 41b and 41c. If Combination 2 is used for a supplementary exposure with the same image receiving sheet to form an image of the same gray scale, the result was good with 6 gradations. With Combination 4, an image with 9 gradations can be obtained. In summary, intermediate gradations can be faithfully reproduced and good image quality can be obtained from a photograph if a supplementary exposure device is made use of. FIG. 3B shows the image density characteristics corresponding to Combination 4.

One of the combinations shown in FIG. 4 is stored in the ROM 22 and this combination of voltages is applied when the switch 25 is in the ON condition. Alternatively, more than one of these combinations may be stored in the ROM 22 such that the operator can select one of them, for example, by means of a selection key to be additionally provided on the control panel.

When typed characters and graphs are copied, on the other hand, there is no need to reproduce intermediate gradations faithfully. Especially where there is unevenness in the original, it is desirable not to have intermediate gradations reproduced. In such a situation, the operator turns off the switch 25 and copying is effected with voltages applied according to Combination 1 of FIG. 4. In this manner, corrections are effected only regarding the coloring in high-density and low-density areas and an image with 4 gradations is obtained. FIG. 3C shows the image density characteristics of the same gray scale original obtained with Combination 1 of FIG. 4. In summary, both images with many gradations and hard images with a high contrast can be selectively obtained merely by operating an on-off switch according to the present invention.

The foregoing description of a preferred embodiment of the invention has been presented for purposes of illustration and description. It is not intended to be exhaustive or to limit the invention to the precise form disclosed. Many modifications and variations are possible in light of the above teaching. For example, the decision between activating or not activating the supplementary exposure device or not need not necessarily be communicated by means of an on-off switch. Instead, a document density sensor may be provided to detect the type of the original document to be copied and the decision may be made automatically according to the output from such a sensor. Such a sensor may be a silicon photocell shown at 42 in FIG. 1 and is adapted to measure the quantity of reflected light and output the measured results as a voltage. With reference to FIG. 5 which is a block diagram of an image forming apparatus of this type, the voltage indicative of the quantity of light detected by the photosensor 42 is integrated by an integrator circuit 27, amplified by an amplifier 28 and then compared with a reference voltage by a judging circuit 29. The result of comparison is communicated through the interface circuit 24 to the CPU 21. The reference voltage is so selected that a graphic document containing characters and graphs can be distinguished from a pictorial original. Determination of reference voltage can be easily made experimentally by measuring the quantity of light (or voltage outputted from the photosensor 42) reflected from test samples of originals. The voltage in the case of graphic documents was about 1–5V according to a series of tests, although this depended upon the character density on the document. In the case of photographs requiring a large gradation number, the voltage was over 6.5V. In other words, the two types of original documents can be distinguished if the reference voltage is set, for example, to 6V.

The present invention is not limited to full color copiers having three light sources 41a, 41b and 41c corresponding to three different types of microcapsules with which the light receiving sheet is coated but the number of light sources emitting light of different colors and the choice of colors are not intended to limit the scope of the invention. A light receiving sheet which is sensitive to ultraviolet light may be used. If use is made of a light receiving sheet which is sensitive to light of only one color, furthermore, there may be no need for supplementary exposure at all because there is no special coloring in such a case. The output from the supplementary exposure device need not be controlled by voltage. Other methods such as by the use of duty ratio may be used in connection with the present invention. In summary, any modifications and variations that may be apparent to a person skilled in the art are intended to be included within the scope of the present invention.

What is claimed is:

1. In an image forming apparatus having a supplementary exposure device for supplementarily exposing a light receiving sheet to light in a wavelength range to which said light receiving sheet is sensitive, the improvement wherein said image forming apparatus further comprises
    an input means for specifying and outputting a command signal indicative of whether or not said light receiving sheet should be supplementarily exposed to light from said supplementary exposure device and
    a driving means for driving or not driving said supplementary exposure device according to said command signal from said input means,
    said input means including a detector for detecting the density of a document to be copied and a command transmitting means for transmitting a command to have or not to have said sheet supplementarily exposed to light from said supplementary exposure device, depending on whether of not the density detected by said detector is greater than a predefined reference value.

2. The image forming apparatus of claim 1 wherein said input means comprises an on-off switch.

3. The imaging forming apparatus of claim 1 wherein said supplementary exposure device includes a blue light source capable of emitting blue light, a green light source capable of emitting green light and a red light source capable of emitting red source.

4. The image forming apparatus of claim 3 wherein said blue, green and red light sources are adjusted to emit blue, green and red light according to the radiation-curability characteristics of the photosensitive materials with which said light receiving sheet is coated.

5. The image forming apparatus of claim 3 wherein said blue, green and red light sources can be and are adjusted to emit blue, green and red light so as to reduce the gamma-values of the photosensitive materials with which said light receiving sheet is coated, said gamma values representing the slopes of the density-log exposure characteristic curves.

6. The image forming apparatus of claim 3 further comprising a memory device which stores a plurality of selected modes of causing said blue, green and red light sources to emit blue, green and red light beams.

7. An image forming apparatus for forming an image of an original document on a light receiving sheet coated with a large number of light-sensitive and pressure-sensitive microcapsulates, said apparatus comprising:
    a supplementary exposure device for supplementarily exposing said light receiving sheet to a supplementary light beam capable of improving the gradation characteristics of said image,
    a driving means for controllingly driving or not driving said supplementary exposure device, and
    a switching means for selectably causing said driving means to controllingly drive or not to drive said supplementary exposure device, depending on the density characteristic of said original.

8. The imaging forming apparatus of claim 7 wherein said supplementary exposure device includes a blue light source capable of emitting blue light, a green light source capable of emitting green light and a red light source capable of emitting red source.

9. The image forming apparatus of claim 8 wherein said blue, green and red light sources are adjusted to emit blue, green and red light according to the radiation-curability characteristics of the photosensitive materials with which said light receiving sheet is coated.

10. The image forming apparatus of claim 8 wherein said blue, green and red light sources can be and are adjusted to emit blue, green and red light so as to reduce the gamma-values of the photosensitive materials with which said light receiving sheet is coated, said gamma values representing the slopes of the density-log exposure characteristic curves.

11. The image forming apparatus of claim 8 further comprising a memory device which stores a plurality of selected modes of causing said blue, green and red light sources to emit blue, green and red light beams.

* * * * *